(12) United States Patent
Deschamp

(10) Patent No.: US 7,528,844 B2
(45) Date of Patent: May 5, 2009

(54) INTERPOLATION OF PLOTTED POINTS BETWEEN SAMPLE VALUES

(75) Inventor: Joseph Deschamp, Schwenksville, PA (US)

(73) Assignee: Harris Corporation, Melbourne, FL (US)

( * ) Notice: Subject to any disclaimer, the term of this patent is extended or adjusted under 35 U.S.C. 154(b) by 361 days.

(21) Appl. No.: 11/271,013

(22) Filed: Nov. 10, 2005

(65) Prior Publication Data

US 2007/0103486 A1    May 10, 2007

(51) Int. Cl.
*G09G 5/00*    (2006.01)

(52) U.S. Cl. .................. 345/606; 345/440; 345/443; 348/180; 348/717; 348/720; 382/250; 382/264; 382/300

(58) Field of Classification Search .......... 345/606, 345/440, 443; 348/180, 717, 720; 382/250, 382/264, 300

See application file for complete search history.

(56) References Cited

U.S. PATENT DOCUMENTS

| | | | | |
|---|---|---|---|---|
| 4,069,500 A | * | 1/1978 | Hurst | 348/182 |
| 4,647,922 A | * | 3/1987 | Saxe | 345/27 |
| 4,866,647 A | * | 9/1989 | Farrow | 708/313 |
| 5,235,534 A | * | 8/1993 | Potter | 708/300 |
| 5,471,411 A | | 11/1995 | Adams et al. | |
| 5,485,199 A | | 1/1996 | Elkind et al. | |
| 5,717,619 A | * | 2/1998 | Spurbeck et al. | 708/319 |
| 6,493,024 B1 | | 12/2002 | Hartley et al. | |
| 6,577,778 B1 | * | 6/2003 | Wu et al. | 382/300 |
| 6,600,495 B1 | | 7/2003 | Boland et al. | |
| 7,136,092 B2 | * | 11/2006 | Whitehouse | 348/182 |
| 2004/0254968 A1 | * | 12/2004 | Ferguson | 708/290 |
| 2005/0226429 A1 | * | 10/2005 | Hollowbush et al. | 381/56 |

FOREIGN PATENT DOCUMENTS

EP    0738089 A1    10/1996
GB    2056825 A    3/1981

OTHER PUBLICATIONS

"Test and Measurement of Serial Digital Television Signals"; Fibush, et. al.; SMPTE Journal 101 (1992), September, No. 9, pp. 622-631.

* cited by examiner

*Primary Examiner*—Kimbinh T Nguyen
(74) *Attorney, Agent, or Firm*—Duane Morris LLP

(57) ABSTRACT

A video display for digitized video data interpolates values between time samples, such as luminance over a horizontal line or over an average of all the horizontal lines in a video signal, so as to produce a digitally plotted test display resembling the continuous line display of an oscilloscope. A digital impulse response filter has stored coefficients that contribute as factors to the values of interpolated data points to fill the line display between sample values. Instead of changing the coefficients to produce variations interpolating the output between sample values, the coefficients are held constant and a delay factor is varied to alter the extent to which the respective coefficients and sample values interact and contribute to the interpolated values.

18 Claims, 3 Drawing Sheets

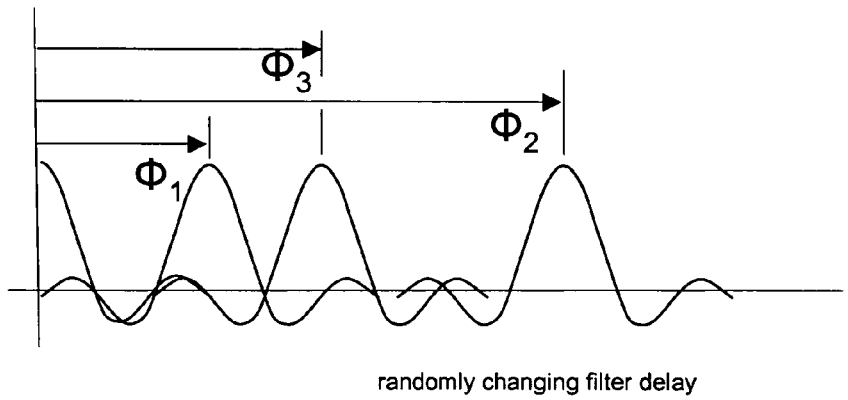
randomly changing filter delay
Fig. 3
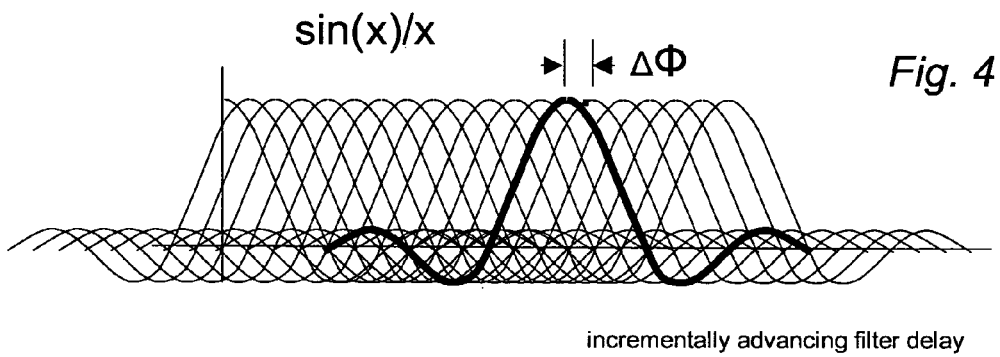
incrementally advancing filter delay
Fig. 4
Fig. 5
Prior Art
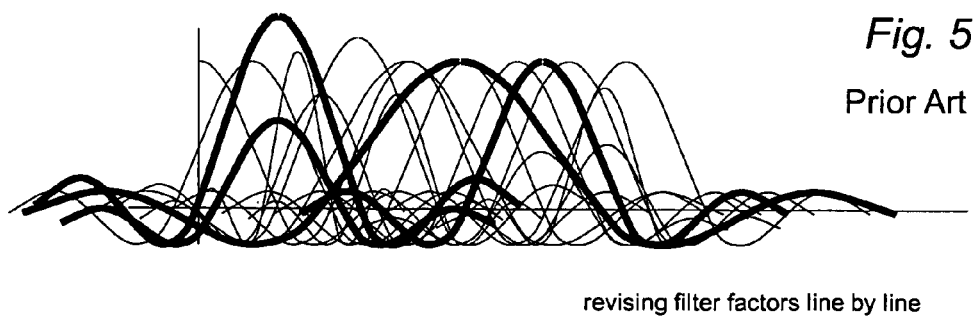
revising filter factors line by line

INTERPOLATION OF PLOTTED POINTS BETWEEN SAMPLE VALUES

FIELD OF THE INVENTION

The invention relates to apparatus and methods for generating a graphic plot of digitally generated sample values, including inferring and plotting values for interpolated points between discrete time-sampled points to produce a more continuous representation of the plot.

The interpolated points can be made closely adjacent, resembling a substantially continuous line. According to an inventive aspect, interpolated values are generated by repetitively selecting different delay values when applying a set of correlation factors to a filter that produces the interpolated values for the plot, for example a plot of amplitude versus time in a display of video signal levels. This technique avoids or minimizes the need to apply new factors to the filter.

PRIOR ART

It is sometimes necessary to infer or interpolate values between values that are known for a particular function to be plotted. In a plot of time samples, for example, interpolated values may be inferred for a variable at times between the discrete sample times at which a value actually is measured. The interpolation might be done for, various reasons. An example is generation of a continuous line plot with the appearance of an oscilloscope display, from input data limited to the sampled values of a particular signal parameter at incrementally spaced discrete times, that otherwise would have to be plotted as spaced dots or as a digitized stairstep pattern.

In video production test apparatus, analog plots of voltage versus time have been used conventionally to display parameter values. Standard color bars and other test pattern signals produce familiar waveform shapes that are useful in test applications. An example is a plot of luminance over a time period corresponding to a horizontal scan line, for a standard test pattern image of vertical color bars. An oscilloscope sweep trace triggered according to the horizontal sync can plot time on a horizontal axis and a voltage representing luminance on a vertical axis. (Other plots and/or variables of course are possible.) If the scan is repeated while the video data is reasonably static, for example while displaying a stationary color bar test pattern, a display is produced that is useful for diagnostic purposes. Even if the video data changes or if the scan is intermittently triggered, the persistence of the oscilloscope phosphors can be sufficient to provide a displayed line. A storage oscilloscope can hold a displayed line for even a single scan.

In time-sampled digital video data, instead of a continuously varying variable value, the video data is a succession of instantaneous sample values measured at regularly spaced times. A plot of the actual data, i.e., the successive sample values, consists of discrete points or dots that are regularly spaced at time increments corresponding to the sampling frequency. If the value of a sample is construed to persist until the next sample (which is a form of interpolation), the plot consists of discrete segments at amplitudes that vary stepwise from one segment to the next.

Interpolation techniques provide values during the time periods between the discrete sampling points. Advantageously, the interpolated values are chosen to approximate how the variable value might be expected actually to change between samples, insofar as possible.

It is possible to convert time-spaced digital samples back into an analog signal wherein the parameter value is represented by a continuously varying level of voltage or current. This is accomplished by applying the samples to a digital-to-analog converter, passing the output of the D/A converter through a low-pass filter to replace a stepwise or similarly varying signal with a smoother line, and finally plotting the level of the output of the low-pass filter versus time using an oscilloscope-like display device. An analog version of an oscilloscope display device has beam deflection amplifiers that produce a horizontal time sweep and a vertical position of the beam that varies with the analog level.

If the device used for plotting the output is a digital display generating device as opposed to an analog oscilloscope with X and Y amplifiers, a processor typically composes a display field of pixels with contrasting brightness and/or hue. The processor generates a plot representing parameter value versus time, by mapping out a line of contrasting pixels in a display memory to correspond to the image that would be produced by a swept beam in an oscilloscope or the like. The data in the display memory is used to produce a plot of amplitude versus time, but without involving corresponding beam deflection as in an oscilloscope. The plot is produced by mathematical scaling and data processing techniques.

In the example of converting samples to analog through a low-pass filter for interpolating values between samples, a digital display device might be used to produce display data by manipulating data a display memory. In such an example, it may be advantageous to convert the analog level from the low-pass filter back again to digital, and to sample at a rate higher than the original sample rate to produce interpolated values for processing by the display generator. It would be desirable to produce the data mathematically, without the complexity of converting back and forth between digital and analog to convert the original samples to low-pass analog and then back to digital at a higher sampling rate.

Converting the data from a stepwise varying set of time samples into a substantially continuously varying set of values for plotting requires a mathematical function that resembles a low-pass filter. The function needs to produce more sample values for filling in the time span of a plot than are available from the input samples alone.

U.S. Pat. No. 6,493,024—Hartley et al. discloses using a digital filter to provide sample values at an effectively higher rate than the input sampling rate, the values falling along a curve that can be smoothed by use of filter correlation factors (e.g., having a low pass transfer function), wherein additional values are interpolated between the known sample values at a rate higher than the sampling rate. This concept may be described as "oversampling" because the samples at the output correspond to a shorter sampling time period (a higher sampling rate). The technique relies on applying a mathematical function to the sample data values to generate virtual time sample values, and not on actual periodic sampling or similar steps. The digital filter and associated processor needs to operate at a sufficient rate to keep up with the input samples and to produce the mapped data in the display memory. The digital filter need not be synchronous with a sampling clock or the like.

In Hartley, a digital filter is employed, having a pattern or succession of several numeric factors applied to a stream of sample values, each factor producing from the sample values a new resulting value as the data passes through the filter. The resulting values from the factors fill in the plotted values to produce a substantially continuous plot from the discrete samples.

The digital filter in Hartley is a transversal finite impulse response (FIR) filter. The factors used are coefficients derived from a $\sin(x)/x$ low pass impulse response curve. In one embodiment, the filter has five stages or sets of coefficients. The mathematical products of the coefficients times the sample values at each stage, are added to determine plotted values. The coefficients define mathematical contributions of each input sample value over a span of values in the output.

In order to fill out the oversampled plotted values and to form a relatively continuous line in the plot of values in the output, the coefficients applied to the digital filter in Hartley are varied. The coefficients are changed for each successive line of sample data, thereby producing slightly different output values. The variation can be an incremental displacement over time of the $\sin(x)/x$ pattern of coefficient values relative to the samples to which the factors are applied. This smoothes the plot over the sampled values and also fills in or interpolates portions of the plot between the resulting output values.

The Hartley digital filter can be used to process one horizontal line of video or can process an entire field of video wherein all the lines of sample data in the field contribute to one plotted curve representing a single line. When used for one line, the line sample data is recycled (used over and over again). Hartley changes the coefficients used for each horizontal line or for each repetition of a given line by applying a new set of coefficients to the filter for each line or repetition of a line. That is, the same filter configuration is used and the coefficients are changed by an incremental phase difference. For each line between the first and last lines of the video field, or for each repetition of a predetermined number of iterations of the same video line, the $\sin(x)/x$ curve from which the coefficients are derived is phase shifted in discrete intervals between $-180°$ and $+180°$.

In the Hartley technique, the coefficients used by the digital filter need to be changed between iterations (changed from one horizontal line to the next, or changed for each repetition of a single horizontal line that is being recycled). Changing the coefficients might possibly involve composing a set of coefficient values for use during each iteration, or possibly by modifying the addressing of stored operands used in successive computations. In any case, a point value is calculated for each incrementally different phase or time and for each line or iteration of a repeated line, thereby producing sample points that are more numerous than the original sample values, and fill in the zones between samples. If the interpolated additional points are sufficiently numerous, the plot that resembles a continuous line.

These arrangements are complex from a standpoint of circuit elements, computational requirements and/or processing time. It would be advantageous if a digital filter could use predetermined coefficients rather than varying them, so that a smoothed oversampled plot can be obtained without the need to re-compute, reload or reselect coefficients for each line. However, it would seem if preloaded coefficients were to be provided in Hartley, a large array of coefficients would be needed to represent a different and discrete set for the sampled points in the horizontal lines of a video field.

SUMMARY OF THE INVENTION

According to the present invention, a different technique is provided for interpolating values to be used in graphically plotting a sampled video parameter as a line of changing amplitude values over time. According to one inventive aspect, a digital filter with predetermined static coefficient values is subjected to a variable delay so as to produce incrementally different values used as interpolated values between sample points. By using a variable delay technique with predetermined coefficients, it is not necessary to employ changing coefficients or to alter or shift the operands used in generating interpolated values. Moreover, according to another aspect, the extent of the variable delay can be randomized over a range of delays or varied according to a preset function.

An object of interpolation in this context is to generate from time-spaced digital samples a presentation that appears to be a plotted line resembling an oscilloscope trace. A digitally produced plot in a pixel field, with or without interpolated values, comprises a line of discrete pixel values. Thus the interpolated output values in a sense still comprise discontinuous sample values after the interpolation. The interpolated values are more dense in the plot than the input samples. By use of the interpolation technique described herein, the output plotted values can be made much more numerous than the time spaced samples that formed the input data. The plotted values can so numerous that the contrasting pixels that define a plotted trace line in a composed pixel field representing the time plot are substantially adjacent to one another along the time axis, i.e., provide a line that is digitized to a time resolution less than or equal to one pixel position per interpolated value. An interpolated value plot also can be generated by the inventive technique wherein the plot is scaled so that the interpolated values are more or less dense than the pixels.

According to a further inventive aspect, a set of fixed digital filter coefficients is employed in a Farrow configuration having plural stages. Each stage has a set of coefficients and the coefficients in the respective stages can differ incrementally by randomized increments or can differ according to a function. Each stage can carry fixed factors according to a low pass finite impulse response filter pattern of coefficient values, such as a $\sin(x)/x$ pattern, wherein a parameter of the coefficient values such as the amplitude, period, relative phase or the like differs from stage to stage.

A variable digital delay element selective alters the delay input to the inventive filter. This tends to vary the resulting interpolated values incrementally, in a manner that resembles a low pass function and also fills in the values between time-spaced input samples. The filter stages are coupled to sum and generate data output values that are oversampled, i.e., more numerous than the time-spaced input samples. By changing the variable delay of the filter according to one or more sequences that can be regular or irregular, the filter produces oversampled values in a substantially more continuous progression than the input samples, preferably sufficient, in view of the pixel resolution of the output device, to appear as a continuous line, but at least being more continuous than the input samples as similarly plotted.

The device is particularly useful for plotting points corresponding to samples in a digitally generated display of video parameters such as the value of luminance over a horizontal line or over an entire video field. The device also can be applied to plotting other parameters in two axes wherein a series of spaced points are known and it is desirable to infer a value on one axis for a substantially more numerous set of values on the other axis. In connection with time sampled data, one axis preferably is a time axis.

Accordingly, the inventive video display for digitized video data interpolates values between time samples, such as luminance over a horizontal line or over an average of all the horizontal lines in a video signal, so as to produce a digitally plotted test display resembling the continuous line display of an oscilloscope. A digital impulse response filter has stored coefficients that contribute as factors to the values of interpolated data points to fill the line display between sample values.

Instead of changing the coefficients to produce variations interpolating the output between sample values, the coefficients are held constant over at least a predetermined period such as one or more video fields. Instead of varying the coefficients during that period, the coefficients remains and a delay factor is varied to alter the extent to which the respective coefficients and sample values interact and contribute to the interpolated values. This arrangement is characterized, for example, in a Farrow filter arrangement where the delay factor can be provided as an input variable to the filter. The delay can be varied randomly or pseudorandomly, or according to a scheme such as an incremental progression of successive delays. The succession of different delays can be generated or simply read out from a set of stored values.

Additional objects and aspects of the invention will become apparent from the following discussion of examples.

BRIEF DESCRIPTION OF THE DRAWINGS

A number of additional objects and aspects are apparent from the appended description and the associated illustrations of preferred embodiments, wherein:

FIG. 3 is a plot representing one possible succession of delays, namely a randomized succession, using a given set of coefficients and a varied succession of delay values.

FIG. 4 is a plot substantially as in FIG. 3, except that the delays are successively advanced by an incremental time or phase value.

FIG. 5 is a plot labeled "prior art," showing for comparison the known technique of changing a coefficient set repetitively.

DETAILED DESCRIPTION

Figure 1:
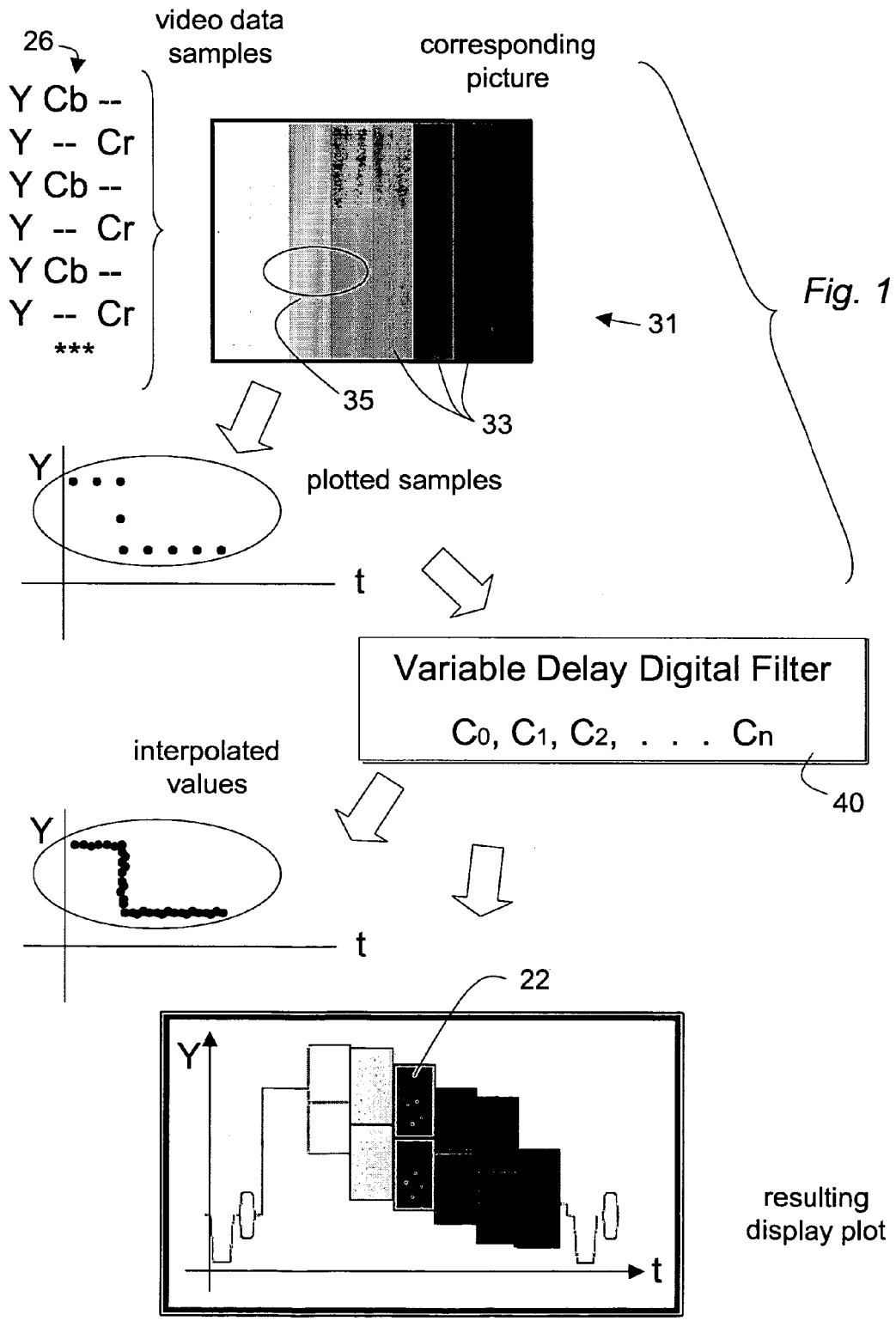
FIG. 1 is a schematic block illustration of the method according to the invention, showing the picture and plot details associated with sampled data inputs as applied to video data.

The video test apparatus and method of the invention are functionally outlined in FIG. 1. The arrangement produces a display plot 22 that resembles a display that one might obtain from an analog oscilloscope coupled to a composite analog video signal, but the inventive arrangement operates on digital samples. A YCbCr source 26 of sample data is shown in FIG. 1. By way of example, the sample data 26 is illustrated as representing a color bar test pattern 31 as the content, namely with vertical bars 33 that vary in luminance, generally having a reduction in luminance were a given band 35 abuts the adjacent bands.

The sample data 26 could represent any sort of data that contains two variables, such as an amplitude variable and a time variable. Luminance is intended as a nonlimiting example and is useful because the variation in luminance across the transitions between successive bands produces a distinct drop in the plotted sample values of luminance over time. As shown in FIG. 1, the plotted samples are simply points. However, by applying a digital filter having finite impulse response (FIR) coefficients $C_0$ to $C_n$, a set of interpolated values are filled in between the samples and thereby produce a line plot 22.

The source 26 of time sampled input data values representing a video parameter at incremental sample times can be any source of a serial stream of digital data samples, e.g., from a broadcast or playback apparatus, or as the output of an analog to digital converter (not shown).

Figure 2:
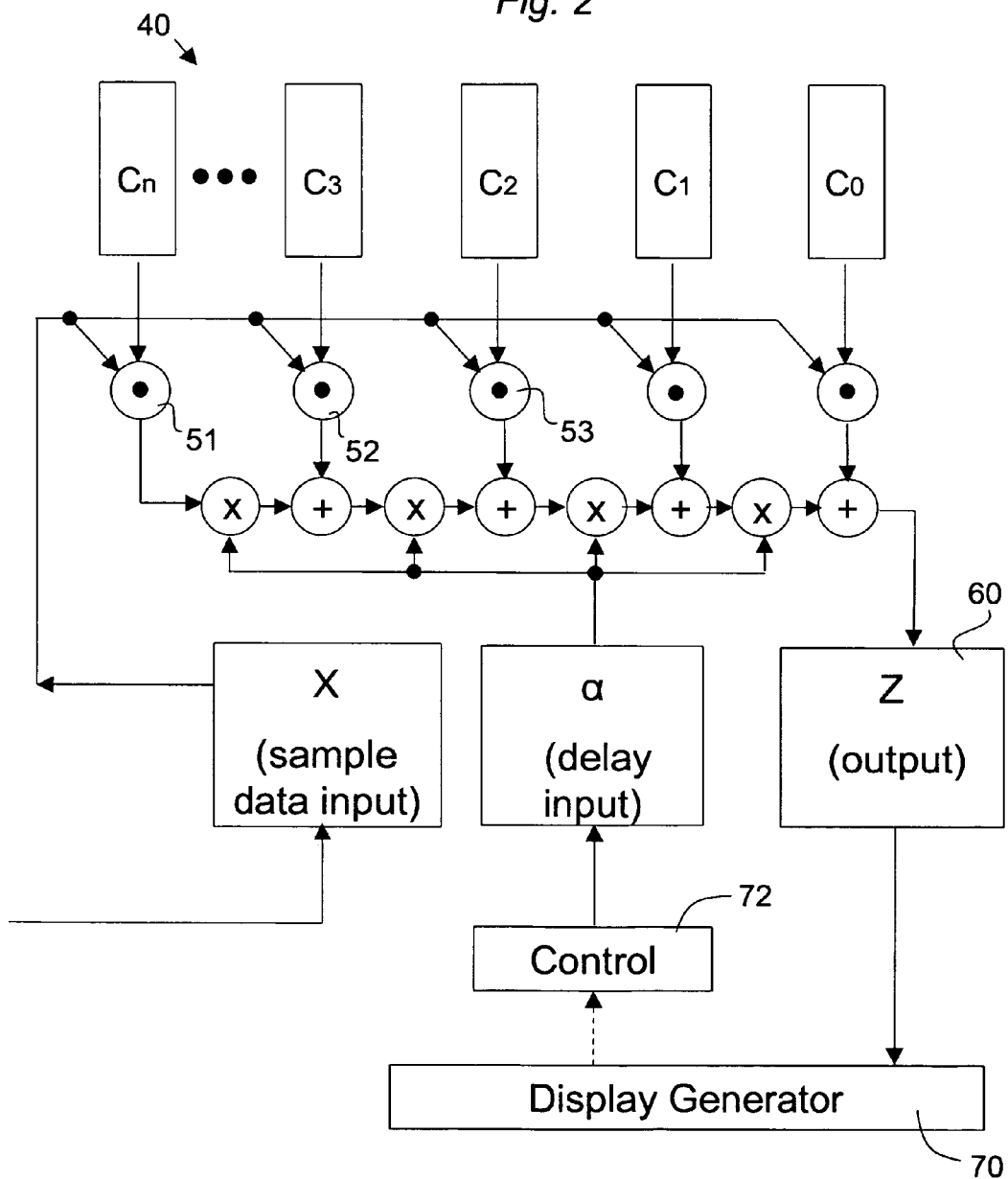
FIG. 2 is a block diagram illustration of a digital filter applicable to the invention, in this case having a Farrow configuration wherein predetermined impulse response coefficients are provided and variably applied according to a controllable delay.

As shown in FIG. 2, the digital filter shifts the values X of the samples through registers while applying the coefficients $C_0$ to $C_n$ to the samples X being applied to the filter and summing the contribution of the coefficients and the sample values to produce an output value Z. The sample values X are multiplied repetitively or iteratively by the coefficients $C_n$ to obtain output values Z that are more numerous than the input values X. The coefficients $C_0$ to $C_n$ represent an impulse response, and can in particular represent, for example, a sin (x)/x function as shown in FIGS. 3 and 4. By providing more numerous values, the filter can produce values that are interpolated between the plotted sample values or the filtered plotted sample values.

Assuming that a same sample value is applied to the digital filter over and over, the result would be the same value for output Z each time, i.e., a stair step function instead of a set of interpolated values that vary meaningfully with changes in the input samples X. According to the prior art, such as U.S. Pat. No. 6,493,024—Hartley et al., the values in of the coefficients $C_0$ to $C_n$ are changed for each repetition, this being generally depicted in FIG. 5 as a set of different transfer function shapes. The Hartley procedure produces interpolated values that are incrementally different and can be used to interpolate points between the otherwise unvarying output value or values Z that would be produced from a given input value or succession of input values X. The drawback of Hartley is that changing the coefficients, whether by calculation or by reading from a memory, requires either complicated circuitry or time consuming data processing steps.

According to an aspect of the present invention, interpolated output values that are incrementally different are provided without changing the coefficients $C_0$ to $C_n$ for each iteration. Instead, a delay input α is provided and changed to alter the timing relationships by which a set array of coefficients $C_0$ to $C_n$ contribute to each output value Z. In the illustration in FIG. 2, a delay factor α is applied to the filter to adjust the delay by which the factors $C_0$ to $C_n$ are applied in their contribution to the output value Z and this delay factor is varied by a control register 72.

The delay value α can be varied according to a sequence, changing with each iteration to a new value and repeating periodically. This effective produces a slightly different relationship between the input values and the output values, in a way that is less complex than varying the coefficients or factors $C_0$ to $C_n$. A greater or smaller delay factor produces a different FIR digital filter output for each iteration and/or interpolated output value. Instead of changing the transfer function coefficients, the result is achieved by varying the delay value applied to the digital Farrow filter.

In a Farrow filter as shown schematically in FIG. 2, the filter has plural coefficients $C_0$ to $C_n$ applied successively to the input data values in computation stages 51, 52, 53, etc. At each of the computation stages, a coefficient $C_0$ to $C_n$ produces from a corresponding input data value Z a product. The products for said plural coefficients and sets are iteratively shifted toward an output 60 and contribute to the output values Z. The output values Z are a filtered version of the input values X, and include interpolated additional values between the input values X.

As shown in FIG. 2, the output values Z are coupled to a display generator 70. This display generator can comprise a processor that also determines the changing value of delay α via a control register 72 that stores one or more delay values.

The display generator 70 plots the stream of output values Z over a time scale, namely by altering the appearance of pixels in a pixel data memory to be employed by a display driver (not shown) to produce a display that can be presented on a monitor. Advantageously, the display is generated as a VGA, SVGA or other standard display field that can be displayed on generic or proprietary monitors as desired.

The coefficients $C_0$ to $C_n$ of the inventive digital filter are constant, at least during a phase of operation of the interpolation apparatus during which multiple input values are processed. It is possible also to change the coefficients or to change the coefficients adaptively or by user selection, as well as changing the delay as described. But according to the invention it is not necessary to change the coefficients because meaningful interpolated values can be produced from a given set of coefficients $C_0$ to $C_n$ by varying the delay factor as described. In a simple application as shown in FIG. 2, a single delay value $\alpha$ can be applied between each successive stage. This tends to alter the transfer function as shown in FIG. 3. Other specific variations are also possible, such as applying random delays to the respective stages (such as a random number of clock cycle delays up to a given maximum). Nevertheless, provided a delay input is coupled to the digital filter, and varied for altering the application of the coefficients to the input data values during a phase wherein the coefficients remain constant, the result is interpolated values at the output Z for use by the display generator 70, to plot as output data values as a function of time.

The invention is primarily applicable to application of a Farrow type digital FIR filter to a video test apparatus wherein it is desirable to plot a serial stream of video parameter values, i.e., video data samples. The generator is enabled by the interpolation as described to plot a substantially continuous line of output data values in a display plot that appears much the same as an oscilloscope trace and represents at least one horizontal line in a video picture. In connection with a test pattern display, a single line plot can represent the composite output produce by repetitively filtering each successive horizontal line in a picture field or frame as the source of iterative input data that at least nominally remains the same from line to line.

The coefficients of the digital filter represent low pass filter coefficient arrays. Unlike the prior art of FIG. 4, wherein the filter applies the same transfer function with a phase delay, the inventive filter as shown in FIG. 3 can alter the transfer function of the low pass filter to produce interpolated values.

The coefficients of the digital filter represent low pass filter coefficient arrays having different attributes. The attribute can encompass different values of at least one of amplitude, period and phase. However, the variability in the values obtained for the respective interpolated points is not produced by regenerating or shifting among different sets of coefficients. Instead, the variability arises by applying the factors in a Farrow filter arrangement as in FIG. 2, that define different delays for the application of each coefficient in each iteration or each new horizontal line of video data. This produces a set of different results by varying the application of the coefficient array without the need to change the coefficient values. This difference is shown in an exemplary arrangements in FIGS. 3 and 4, which show alternatives ways to change the delay input factor applied to the coefficient stages. This technique is distinct from varying coefficient value patterns, or perhaps successively varying the coefficients for different phases or transfer function envelopes, shown in FIG. 5 and labeled as prior art (e.g., as in Hartley). The inventive technique is computationally uncomplicated and requires minimal associated circuitry.

In the inventive technique, at least one of the filter coefficient arrays can represent a sin(x)/x transfer function. This is also true in Hartley. The inventive technique specifically employs a Farrow filter as opposed to a digital FIR with iteratively re-computed or iteratively re-written coefficients as in the Hartley technique.

The control 72 coupled to the delay input $\alpha$ of the digital filter varies the manner of application of the fixed coefficients to the data values. Repeating a given succession of input data samples, for example by repetitively processing successive horizontal lines in a color test bar pattern or repetitively processing one or more individual horizontal lines that may be selected for display, produces a succession of slightly different output values, due to time variation of the delay input by the control. In this way and as shown in FIG. 1, the discrete dots of time-spaced plotted sample values are replaced with a substantially continuous line of closely spaced interpolated values, the data values between the plotted samples being inferred using filter coefficients that according to different delay values.

The control can vary the delay input in any of a number of different ways that provide a variation in the data applied for each interpolation point. The delay can be varied according to one or more of a time changing function of incrementally different delays between endpoints defining maximum and minimum delays, or by cycling through a succession of stored delay values. Another alternative is to select delay values according to a random or pseudo random succession.

According to the foregoing description, the interpolated values are determined for introducing new points between the samples as shown in FIG. 1. The actual generation of the display plot is a function of the display generator 70, shown coupled to the output of the digital filter in FIG. 2. The digital filter can be a dedicated circuit or a programmed gate array device, or simply a function of a processor controlled by its programming to make the necessary calculations. The display generator likewise can involve a separate device or a function of a processor having this and other functions as well. The display generator can comprise a conventional pixel memory from which a display driver will produce a signal for controlling a display device. Preferably, the display generator has a stored background image that would produce a blank graphic plot, and is programmed to populate the graphic plot by altering the luminance, color or other contrast producing attributes of pixels corresponding to the spatial points at which the plotted line is to appear. Thus, the output values are mapped to addresses in the pixel memory so as to produce a plot of amplitude (or other quantified parameter) versus time. The plot can be generated repetitively or only selectively generated. Various options can be selected including changing the displayed parameter, changing the time or amplitude scaling, selecting the portion of the signal to be processed (e.g., one horizontal line or several or all of the horizontal lines, etc.).

Preferably, the data plotted to the pixel memory by the display processor is mapped on an incremental time scale by which at least one of said output values is plotted to each of plural positions along a time axis. More preferably, every pixel position along the time axis can have at least one point plotted to represent a value along the amplitude axis. As a result, the plot appears to be a continuous line at the resolution of the time axis of pixel positions, even though the input samples may have been less numerous than the number of pixel time axis positions available to the display device.

From an apparatus standpoint, the invention concerns an interpolating device for operating on samples from an input receiving successive discrete input data values of a parameter defined by at least two variables. Preferably the at least two variables include a direct value or a derivable value as a function of time (Y=f(t)) and are presented by repetitive time samples.

A digital filter (FIG. 2) produces from each of the input data values (FIG. 1: video data samples), a set of plural output data values (interpolated values). The output values are more numerous than the input values and the output values interpolate between the input values. According to an inventive aspect, the digital filter has a plurality of coefficients (FIG. 2: $C_0$-$C_n$) applied to the input data values through at least one computation stage, wherein each of said coefficients produces from each said input data value a product contributing to at least one of the data values of the output set. The coefficients of the digital filter remain constant during at least a phase of operation of the interpolation apparatus during which plural input values are processed. A delay control is coupled to the digital filter, the delay control altering the application of the coefficients to the input data values during the phase wherein the coefficients remain constant. As discussed, the preferred digital filter comprises a Farrow type filter with the input samples applied to factors representing a coefficient pattern, subject to the delay.

From a method standpoint, processing the video parameter value sampled over time according to the invention includes applying to a digital filter a source of time sampled input data values representing the video parameter at incremental sample times; computing with the digital filter a set of plural output data values for each of the input values, thereby interpolating values for times between the sample times, wherein the digital filter has plural sets of stored coefficients applied successively to the input data values through at least one computation stage, each coefficient in the plural sets producing from a corresponding input data value a product, the products for said plural coefficients and sets contributing to the output values including said interpolated additional values according to a polynomial function embodied by the digital filter; wherein the coefficients of the digital filter are held constant during at least a phase of operation of the interpolation apparatus during which plural input values are processed; providing a delay control to the digital filter, for altering the application of the coefficients to the input data values during the phase wherein the coefficients remain constant, thereby causing variations in the output values for a given set of input values due to the delay control.

The video parameter is a video data sample and the output values are plotted to points on a display. Preferably the plot represents at least one horizontal line in a picture. Alternatively, and preferably subject to selection of an operational mode, the output data values that are plotted can represent multiple horizontal lines in the picture.

It is an aspect of the invention that instead of re-computing or re-configuring a set of coefficients (e.g., at incrementally different phase positions), the coefficients of the invention are predetermined, i.e., permanently stored. The coefficients can represent a low pass filter coefficient array, such as a sin(x)/x pattern or the like, stored as the coefficients of the digital filter. However, it is also possible to permit a selection among different arrays or patterns according to programmed selection or user input, for choosing low pass filter coefficient arrays so as to include different attributes for at least one of amplitude, period and/or phase. This choice can involve computation or randomization of values, but by embodying the digital filter as a Farrow filter or other filter having a varying delay, the invention permits a given set of values to generate interpolated points that are more numerous and are incrementally different from one another and from the time spaced sample points, such that the samples can be represented as a substantially continuous plotted line of points.

The invention having been disclosed in connection with the foregoing preferred arrangements, variations will now be apparent, and should be considered encompassed within the scope and spirit of the invention.

What is claimed is:

1. A video test apparatus for graphically plotting a value of a video parameter, comprising:
   a source of time sampled input data values representing a video parameter at incremental sample times;
   a digital filter operable to produce from each of the input data values a set of plural output data values, wherein the output values comprise interpolated additional values of the parameter between the sample times;
   wherein the digital filter has plural sets of coefficients applied to the input data values through at least one computation stage, wherein each coefficient in the plural sets produces from a corresponding input data value a product, the products for said plural coefficients and sets contributing to the output values including said interpolated additional values;
   wherein the coefficients of the digital filter are constant during at least a phase of operation of the interpolation apparatus during which plural input values are processed;
   further comprising a delay control coupled to the digital filter, the delay control varying a delay input to the digital filter over time while plotting said value of the video parameter, so as to generate the additional values of the parameter between the sample times; and,
   a display generator operable to plot a graph of the output data values versus an axis representing time, including plotting said additional values of the parameter between the sampled values to produce a more continuous line.

2. The video test apparatus of claim 1, wherein the video parameter is a video data sample and the display generator plots the output data values as a representation of at least one horizontal line in a picture.

3. The video test apparatus of claim 2, wherein the output data values are a representation of multiple horizontal lines in the picture.

4. The video test apparatus of claim 1, wherein the coefficients of the digital filter represent low pass filter coefficient arrays.

5. The video test apparatus of claim 4, wherein the coefficients of the digital filter represent low pass filter coefficient arrays having different attributes in at least one of amplitude, period and phase.

6. The video test apparatus of claim 5, wherein at least one of the filter coefficient arrays represents a sin(x)/x transfer function.

7. The video test apparatus of claim 6, wherein the digital filter comprises a Farrow configuration of said coefficients and said computation stage.

8. The video test apparatus of claim 7, wherein the delay control coupled the digital filter varies operation of the filter such that a given succession of input data samples when repeated produces a different succession of output values due to time variation of the delay input by the delay control.

9. The video test apparatus of claim 7, wherein the control applies to the delay input one of a time changing function, a succession of stored values and an at least partly randomized set of values.

10. The video test apparatus of claim 1, wherein the display generator comprises a pixel memory and wherein the output values are mapped to addresses in the pixel memory.

11. The video test apparatus of claim 10, wherein the addresses in the pixel memory are mapped on an incremental time scale by which at least one of said output values is plotted to each of plural positions along a time axis.

12. A method for plotting a video parameter value having discrete sampled spaced in time, comprising:
providing a display generator operable to display a graph of values plotted along two axes, of which one of the axes represents time and an other of the axes represents the video parameter value;
applying to a digital filter a source of time sampled input data values representing the video parameter at incremental sample times;
computing with the digital filter a set of plural output data values for each of the input values, thereby interpolating values for times between the sample times, wherein the digital filter has plural sets of stored coefficients applied to the input data values through at least one computation stage, each coefficient in the plural sets producing from a corresponding input data value a product, the products for said plural coefficients and sets contributing to the output values including said interpolated additional values according to a polynomial function embodied by the digital filter;
wherein the coefficients of the digital filter are held constant during at least a phase of operation of the interpolation apparatus during which plural input values are processed;
providing a variable delay control to the digital filter, and varying the delay control during at least the phase of operation of the digital filter wherein the coefficients remain constant, thereby causing variations in the output values for a given set of input values due to the delay control.

13. The method of claim 12, wherein the video parameter is a video data sample and further comprising plotting the output values on a display for representing at least one horizontal line in a picture.

14. The method of claim 13, wherein the output data values are a representation of multiple horizontal lines in the picture.

15. The method of claim 12, comprising permanently storing low pass filter coefficient arrays as the coefficients in the digital filter.

16. The method of claim 15, further comprising choosing the low pass filter coefficient arrays so as to include different attributes for at least one of amplitude, period and phase.

17. The method of claim 12, comprising configuring at least part of the digital filter as a Farrow filter.

18. The method of claim 12, comprising applying to the delay control at least one of a time changing function, a succession of stored values and an at least partly randomized set of values.

* * * * *